(12) United States Patent
Lasiter et al.

(10) Patent No.: US 10,685,924 B2
(45) Date of Patent: Jun. 16, 2020

(54) ANTENNA-ON-PACKAGE ARRANGEMENTS

(71) Applicant: QUALCOMM Incorporated, San Diego, CA (US)

(72) Inventors: Jon Bradley Lasiter, Stockton, CA (US); Ravindra Vaman Shenoy, Dublin, CA (US); Donald William Kidwell, Jr., Los Gatos, CA (US); Mohammad Ali Tassoudji, San Diego, CA (US); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/686,131

(22) Filed: Aug. 24, 2017

(65) Prior Publication Data
US 2019/0067219 A1 Feb. 28, 2019

(51) Int. Cl.
*H01Q 9/04* (2006.01)
*H01L 23/66* (2006.01)
(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/31* (2013.01); *H01L 23/3114* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 25/16* (2013.01); *H01L 25/50* (2013.01); *H01Q 1/2283* (2013.01); *H01Q 9/0407* (2013.01); *H01L 2221/68345* (2013.01); *H01L 2221/68359* (2013.01); *H01L 2221/68381* (2013.01); *H01L 2223/6616* (2013.01); *H01L 2223/6677* (2013.01); *H01L 2224/04105* (2013.01); *H01L 2224/12105* (2013.01);
(Continued)

(58) Field of Classification Search
USPC ........................................................ 257/428
See application file for complete search history.

(56) References Cited

U.S. PATENT DOCUMENTS 8,952,521 B2  2/2015  Wojnowski et al.
2007/0164907 A1  7/2007  Gaucher et al.
(Continued)

FOREIGN PATENT DOCUMENTS

WO  2016092084 A1  6/2016

OTHER PUBLICATIONS

Akkermans J.A.G., et al., "Antennas and Packaging for Millimeter-Wave Phased-Array Transceivers," 38th European Microwave Conference, EuMIC 2008, pp. 1-34.
(Continued)

*Primary Examiner* — Timor Karimy
(74) *Attorney, Agent, or Firm* — Muncy, Geissler, Olds & Lowe

(57) ABSTRACT

An package and related methods are disclosed. The package may include an antenna, an insert made of low-loss material, and a mold, wherein the mold directly contacts and surrounds at least a portion of the insert, wherein the antenna is formed of conductive material disposed at least in part on a surface of the insert.

12 Claims, 15 Drawing Sheets

(51) Int. Cl.
*H01L 23/31* (2006.01)
*H01L 25/16* (2006.01)
*H01L 21/683* (2006.01)
*H01L 23/00* (2006.01)
*H01L 21/48* (2006.01)
*H01L 21/56* (2006.01)
*H01L 23/538* (2006.01)
*H01L 25/10* (2006.01)
*H01L 25/00* (2006.01)
*H01Q 1/22* (2006.01)
*H01Q 21/28* (2006.01)

(52) U.S. Cl.
CPC .... *H01L 2224/18* (2013.01); *H01L 2224/214* (2013.01); *H01L 2225/1035* (2013.01); *H01L 2225/1058* (2013.01); *H01L 2924/10253* (2013.01); *H01L 2924/18162* (2013.01); *H01Q 21/28* (2013.01)

(56) References Cited

U.S. PATENT DOCUMENTS

| | | | |
|---|---|---|---|
| 2014/0035935 A1 | 2/2014 | Shenoy et al. | |
| 2014/0145884 A1* | 5/2014 | Dang | H01Q 1/2283 343/700 MS |
| 2014/0152509 A1 | 6/2014 | Liu et al. | |
| 2014/0252573 A1 | 9/2014 | Lin et al. | |
| 2015/0084830 A1* | 3/2015 | Elsherbini | H01Q 9/0414 343/893 |
| 2015/0325925 A1 | 11/2015 | Kamgaing et al. | |
| 2016/0240492 A1 | 8/2016 | Wolter et al. | |
| 2016/0284642 A1* | 9/2016 | Ganesan | H01L 25/0655 |
| 2017/0033062 A1 | 2/2017 | Liu et al. | |
| 2017/0048981 A1 | 2/2017 | Hu et al. | |
| 2017/0324135 A1* | 11/2017 | Blech | H01P 3/121 |
| 2017/0345761 A1* | 11/2017 | Yu | H01L 23/5389 |

OTHER PUBLICATIONS

Hoivok N., et al., "High-Efficiency 60 GHz Antenna Fabricated Using Low-Cost Silicon Micromachining Techniques," IEEE Antennas and Propagation Society International Symposium, Jun. 9-15, 2007, pp. 5043-5046.

Kam D.G., et al., "Low-Cost Antenna-in-Package Solutions for 60-GHz Phased-Array Systems," IEEE 19th Conference on Electrical Performance of Electronic Packaging and Systems, Oct. 25-27, 2010, pp. 93-96.

International Search Report and Written Opinion 13 PCT/US2018/045401—ISA/EPO—Nov. 15, 2018.

* cited by examiner

ANTENNA-ON-PACKAGE ARRANGEMENTS

INTRODUCTION

Aspects of this disclosure relate generally to wireless communication devices, and more particularly to antenna-on-package (AOP) arrangements and the like.

Wireless communication systems are widely deployed to provide various types of communication content, such as voice, data, multimedia, and so on. Typical wireless communication systems are multiple-access systems capable of supporting communication with multiple users by sharing available system resources (e.g., bandwidth, transmit power, etc.). Examples of such multiple-access systems include Code Division Multiple Access (CDMA) systems, Time Division Multiple Access (TDMA) systems, Frequency Division Multiple Access (FDMA) systems, Orthogonal Frequency Division Multiple Access (OFDMA) systems, and others. These systems are often deployed in conformity with specifications such as Long-Term Evolution (LTE) provided by the Third Generation Partnership Project (3GPP), Ultra Mobile Broadband (UMB) and Evolution Data Optimized (EV-DO) provided by the Third Generation Partnership Project 2 (3GPP2), 802.11 provided by the Institute of Electrical and Electronics Engineers (IEEE), etc.

Wireless communication devices include an antenna and one or more integrated circuits. These components may be arranged in a number of different ways, for example, antenna-in-package (AIP), antenna-on-package (AOP), antenna-on-chip (AOC), etc.

In conventional AOP arrangements, electrical signals travel through one or more traces and/or one or more through vias (for example, through-mold vias (TMV), through-substrate vias (TSV), through-package vias (TPV), through-insert vias (TIV), etc.). The traces and vias may be made of conductive material and may also be in contact with and/or at least partially surrounded by a dielectric material. Conventional dielectric materials, such as silicon or mold compound, cause dielectric loss, meaning that they suffer from current leakage, stray capacitance, etc. Accordingly, lossy materials may impede the performance of conventional AOP arrangements, especially in high-frequency applications. Accordingly, new materials and/or new arrangements of materials are needed.

SUMMARY

The following summary is an overview provided solely to aid in the description of various aspects of the disclosure and is provided solely for illustration of the aspects and not limitation thereof.

In one example, an integrated package is disclosed. The package may include, for example, an antenna, an insert made of low-loss material, and a mold, wherein the mold directly contacts and surrounds at least a portion of the insert, wherein the antenna is formed of conductive material disposed at least in part on a surface of the insert.

In another example, a method is disclosed. The method may include, for example, providing an insert made of low-loss material, providing a mold such that the mold directly contacts and surrounds at least a portion of the insert, and disposing conductive material on at least a surface of the insert, wherein the conductive material forms an antenna.

In yet another example, another package is disclosed. The package may include, for example, means for transmitting and receiving electromagnetic radiation, means for reducing dielectric loss, and means for insulating conductive material, wherein the means for insulating conductive material directly contacts and surrounds at least a portion of the means for reducing dielectric loss, wherein means for transmitting and receiving electromagnetic radiation is disposed at least in part on a surface of the means for reducing dielectric loss.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

In accordance with aspects of the disclosure, new materials and/or new arrangements of materials are used to reduce dielectric loss and improve the operation of AOP arrangements. In particular, a low-loss material (LLM) such as glass and/or synthetic quartz is incorporated into AOP arrangements. The LLM may be more expensive than lossy material like silicon or mold compound. As a result, swapping out lossy material and substituting LLM may improve AOP arrangements, but may also increase fabrication cost.

In accordance with aspects of the disclosure, LLM is strategically placed at positions within the AOP package, in particular, positions where the cost-effectiveness is greatest. As a result, the performance of AOP arrangements, especially in high-frequency applications, may be improved in a cost-effective manner.

Figure 1:
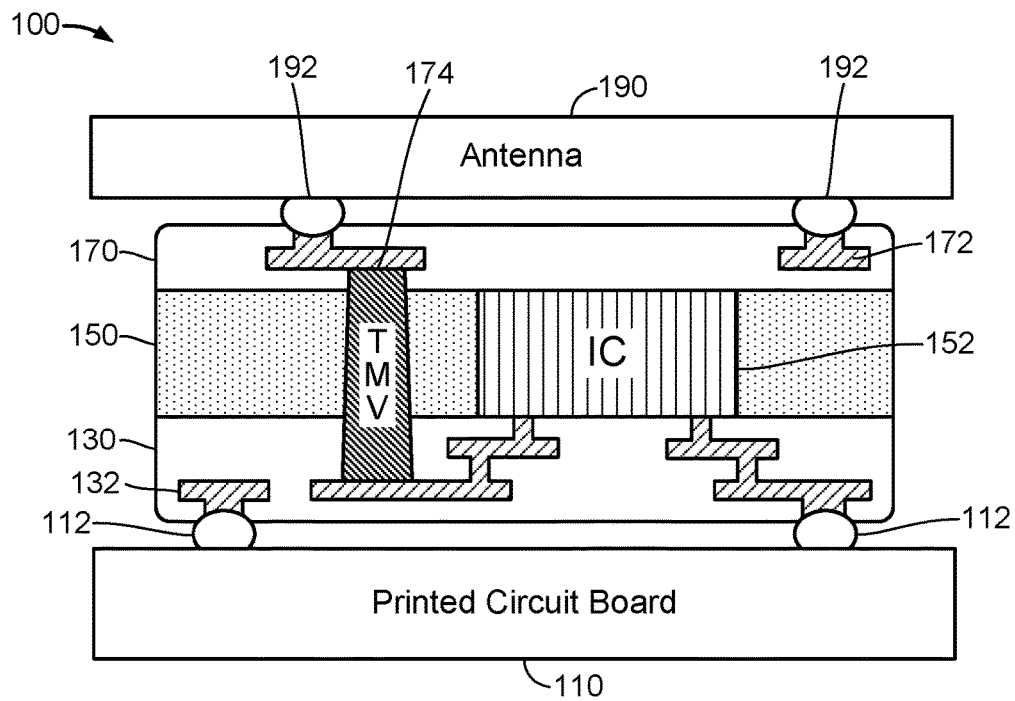
FIG. 1 generally illustrates a conventional AOP arrangement.

FIG. 1 generally illustrates a conventional AOP arrangement 100. The conventional AOP arrangement 100 may be mounted on a circuit board 110 having one or more circuit board contacts 112. The conventional AOP arrangement 100 further includes a first insulating layer 130 having first traces 132 therein. The circuit board contacts 112 may be connected to and/or in physical contact with both the circuit board 110 and/or the first traces 132. The first traces 132 may be at least partially embedded in the first insulating layer 130 and may extend horizontally and/or vertically throughout the first insulating layer 130.

The conventional AOP arrangement 100 further includes a mold layer 150 having an integrated circuit 152. The integrated circuit 152 may be coupled to the circuit board 110 via the first traces 132 and the circuit board contacts 112. The integrated circuit 152 may be further connected to a through via 174 (for example, a through-mold via). The through via 174 may extend vertically through the mold layer 150 and may be configured to couple the first traces 132 to a second insulating layer 170. The vertical extension of the through via 174 may proceed through the mold layer 150 and terminate at second traces 172 embedded in the second insulating layer 170. The second traces 172 may be at least partially embedded in the second insulating layer 170 and may extend horizontally and/or vertically throughout the second insulating layer 170.

The second insulating layer 170 may be coupled to an antenna package 190 via one or more antenna package contacts 192. The first traces 132, second traces 172, and through via 174 may be arranged so that the antenna package 190 can communicate with the integrated circuit 152, and so that the conventional AOP arrangement 100 can communicate with the circuit board 110.

In the conventional AOP arrangement 100, electrical signals travel through the through via 174, which may be made of conductive material, and through an antenna in the antenna package 190. The through via 174 and/or antenna may be in contact with and at least partially surrounded by, for example, silicon or mold compound. Silicon and mold compound may exhibit dielectric loss, meaning that they suffer from current leakage and/or stray capacitance. Accordingly, lossy materials may impede the performance of the conventional AOP arrangement 100, especially in high-frequency applications.

FIGS. 2-7 generally illustrate different AOP arrangements, all of which incorporate LLM (for example, glass, synthetic quartz, organic laminate, ceramic, and/or any other low-loss material). In some implementations, LLM is a material that experiences ohmic loss that is below a particular threshold. The ohmic loss may be attributable to a loss tangent. Accordingly, a material with a loss tangent that is less than, for example, 0.004 at 10 GHz, may be considered an LLM. Additionally or alternatively, a material with a dielectric constant that is less than, for example, 3.5 at 10 GHz may be considered an LLM. The dielectric constant has a loading effect which causes mismatch in reflection scenarios at boundaries of the material, but does not contribute to loss in antennas. The LLM may be strategically placed at positions within the AOP package, in particular, positions where the cost-effectiveness are greatest, for example, adjacent to vias, traces, and/or other elements (for example, an antenna). Strategic placement of LLM inserts may involve the bottom package only (as in FIG. 2), both the bottom package and top package (as in FIG. 3), or the top package only (as in FIG. 4).

Figure 2:
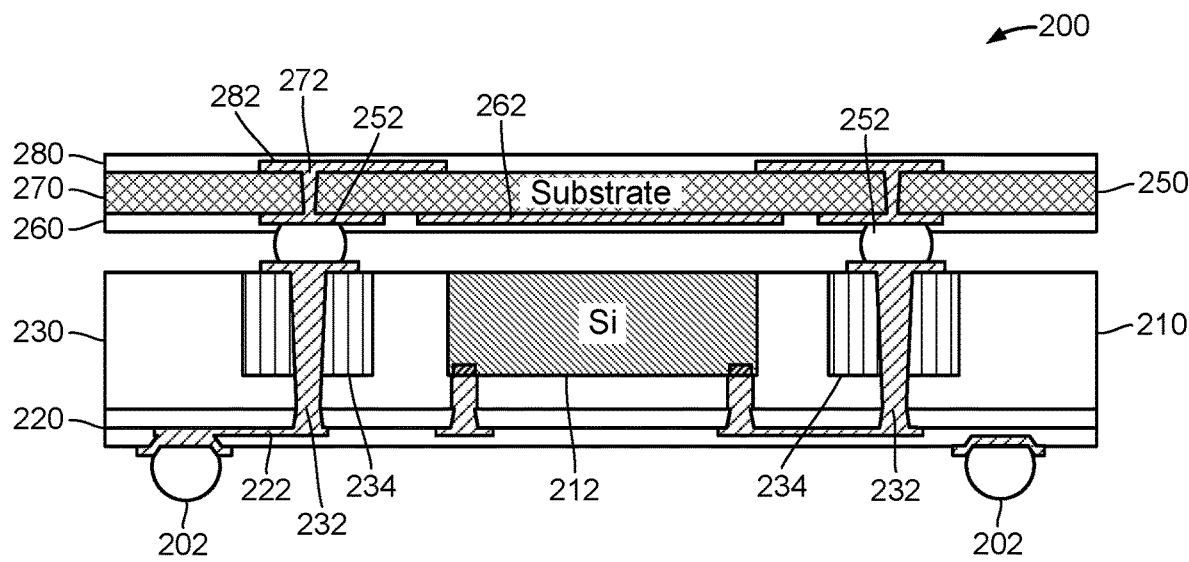
FIG. 2 generally illustrates an AOP arrangement in accordance with aspects of the disclosure.

FIG. 2 generally illustrates an AOP arrangement 200 in accordance with aspects of the disclosure. The AOP arrangement 200 may be mounted on a fanout panel package 210 having one or more TOP contacts 202 and a die 212. The fanout panel package 210 may include a redistribution layer 220 and a mold layer 230. The redistribution layer 220 may include redistribution traces 222 that are coupled to the one or more AOP contacts 202. The redistribution traces 222 may extend vertically through the redistribution layer 220 and/or horizontally within the redistribution layer 220 (for example, between sub-layers of the redistribution layer 220). The redistribution traces 222 may be further coupled to the die 212 and to a through via 232 that extends through a LLM insert 234 in the mold layer 230 in the direction of an antenna package 250. The LLM insert 234 may contact and/or surround the through via 232 or a portion thereof and may be configured to reduce dielectric loss. In some implementations, the LLM insert 234 substantially surrounds the through via 232.

The LLM insert 234 depicted in FIG. 2 is strategically placed in order to reduce dielectric loss in a cost-efficient manner. As noted above, it may not be cost-effective to construct the entirety of the mold layer 230 with LLM materials. However, the dielectric loss caused by movement of electrical current through the through via 232 may be reduced significantly through the incorporation of the LLM insert 234. Other portions of the mold layer 230 (for example, those portions not proximate to the through via 232) may be fabricated using less-expensive materials, for example, silicon and/or molding compound. The antenna package 250 may include one or more antenna package contacts 252 that couple the antenna package 250 to the top side of the fanout panel package 210 and/or the through via 232. The antenna package 250 may include an antenna package bottom layer 260, an antenna package substrate 270, and an antenna package top layer 280. The antenna package bottom layer 260 may include antenna bottom traces 262 and the antenna package top layer 280 may include antenna top traces 282. The antenna bottom traces 262 and the antenna top traces 282 may be coupled to one another by a through via 272 (for example, a through-package via) within the antenna package substrate 270. The antenna bottom traces 262 and/or the antenna top traces 282 may be configured to jointly or individually transmit and/or receive electromagnetic radiation. The antenna bottom traces 262 and/or the antenna top traces 282 may be formed as a patch antenna, for example, a low-profile rectangular antenna that is mounted on a ground plane and provided on a flat surface.

Figure 3:
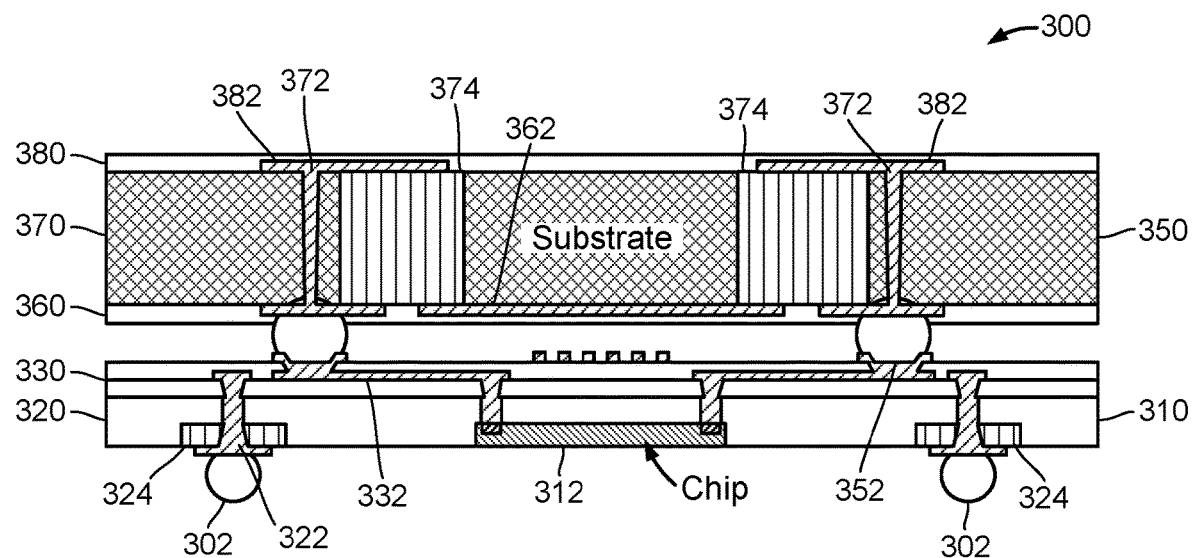
FIG. 3 generally illustrates another AOP arrangement in accordance with aspects of the disclosure.

FIG. 3 generally illustrates an AOP package 300 in accordance with aspects of the disclosure. The AOP package 300 may be mounted on a fanout panel package 310 having one or more AOP contacts 302 and a die 312. The fanout panel package 310 may include a mold layer 320 and a redistribution layer 330 having redistribution traces 332. The mold layer 320 may include a through via 322 that is in contact with and/or surrounded by a LLM insert 324. The through via 322 may be coupled to the AOP contacts 302 and the redistribution traces 332. Unlike the AOP arrangement 200 depicted in FIG. 2, in which the mold layer 230 is disposed on top of the fanout panel package 210, the AOP package 300 depicted in FIG. 3 may include a mold layer 320 that is disposed on the bottom of the fanout panel package 310. The redistribution traces 332 may be coupled to the die 312 and/or one or more antenna package contacts 352.

The fanout panel package 310 may communicate with an antenna package 350 via the one or more antenna package contacts 352. The antenna package 350 may include an antenna package bottom layer 360, an antenna package substrate 370, and an antenna package top layer 380. The antenna package bottom layer 360 may include antenna bottom traces 362 and the antenna package top layer 380 may include antenna top traces 382. The antenna package substrate 370 may include a through via 372 that couples the antenna bottom traces 362 and the antenna top traces 382 to one another. The antenna bottom traces 362 and/or the antenna top traces 382 may be configured to jointly or individually transmit and/or receive electromagnetic radiation. The antenna bottom traces 362 and/or the antenna top traces 382 may be formed as a patch antenna.

The antenna package substrate 370 may also include one or more LLM inserts 374. The LLM insert 374 may be provided within the antenna package substrate 370 such that it is in contact with at least a portion of an antenna formed by the antenna bottom traces 362 and/or the antenna top traces 382. As a result, dielectric loss caused by movement of electrical current through the antenna bottom traces 362 and antenna top traces 382 can be reduced.

Figure 4:
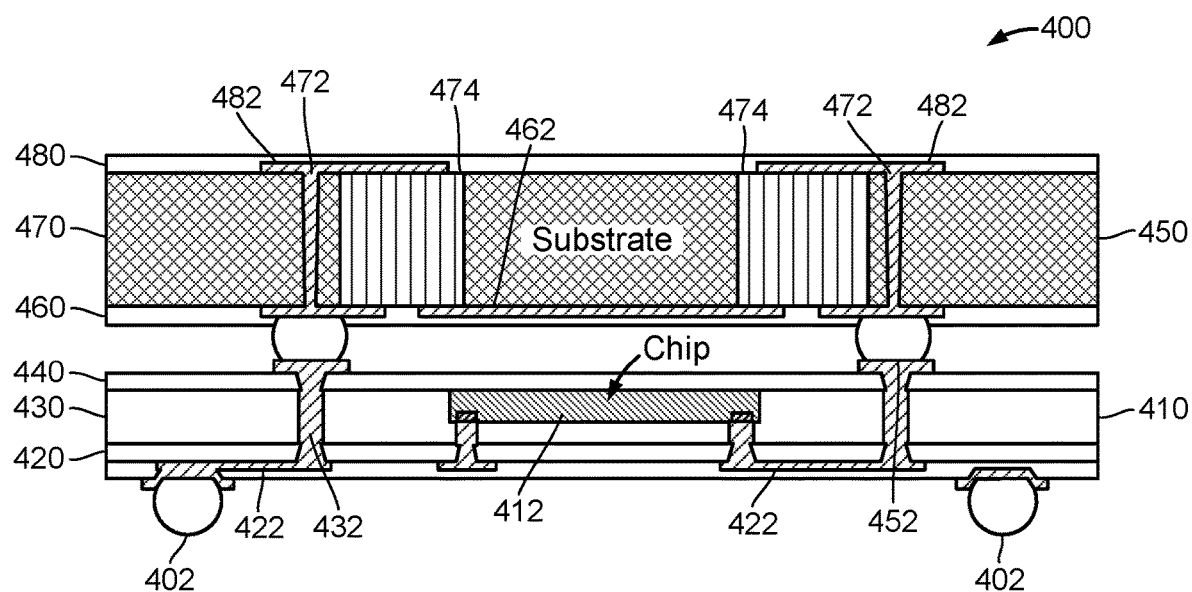
FIG. 4 generally illustrates yet another AOP arrangement in accordance with aspects of the disclosure.

FIG. 4 generally illustrates an AOP package 400 in accordance with aspects of the disclosure. The top package of the AOP package 400 is similar to the top package of the AOP package 300. In particular, the antenna package 450 is analogous to the antenna package 350, the antenna package contacts 452 are analogous to the antenna package contacts 352, the antenna package bottom layer 460, antenna package substrate 470, and antenna package top layer 480 are analogous to the antenna package bottom layer 360, antenna package substrate 370, and antenna package top layer 380, respectively, and the antenna bottom traces 462, antenna top traces 482, through via 472, and LLM insert 474 are analogous to the antenna bottom traces 362, antenna top traces 382, through via 372, and LLM insert 374, respectively.

The bottom package of the AOP package 400 (the fanout panel package 410) may be similar in some respects to the fanout panel package 210 depicted in FIG. 2. In particular, an AOP contact 402 is analogous to the AOP contact 202, a die 412 is analogous to the die 212, a redistribution layer 420 and a mold layer 430 are analogous to the redistribution layer 220 and the mold layer 230, respectively, and redistribution traces 422 and through via 432 are analogous to the redistribution traces 222 and through via 232, respectively. However, unlike the bottom package of the AOP arrangement 200, the AOP package 400 further includes a fanout panel package top layer 440 including traces 442 through which the through via 432 is coupled to the antenna package contacts 452. Moreover, the mold layer 430 does not include a LLM insert analogous to the LLM insert 234.

Figure 5:
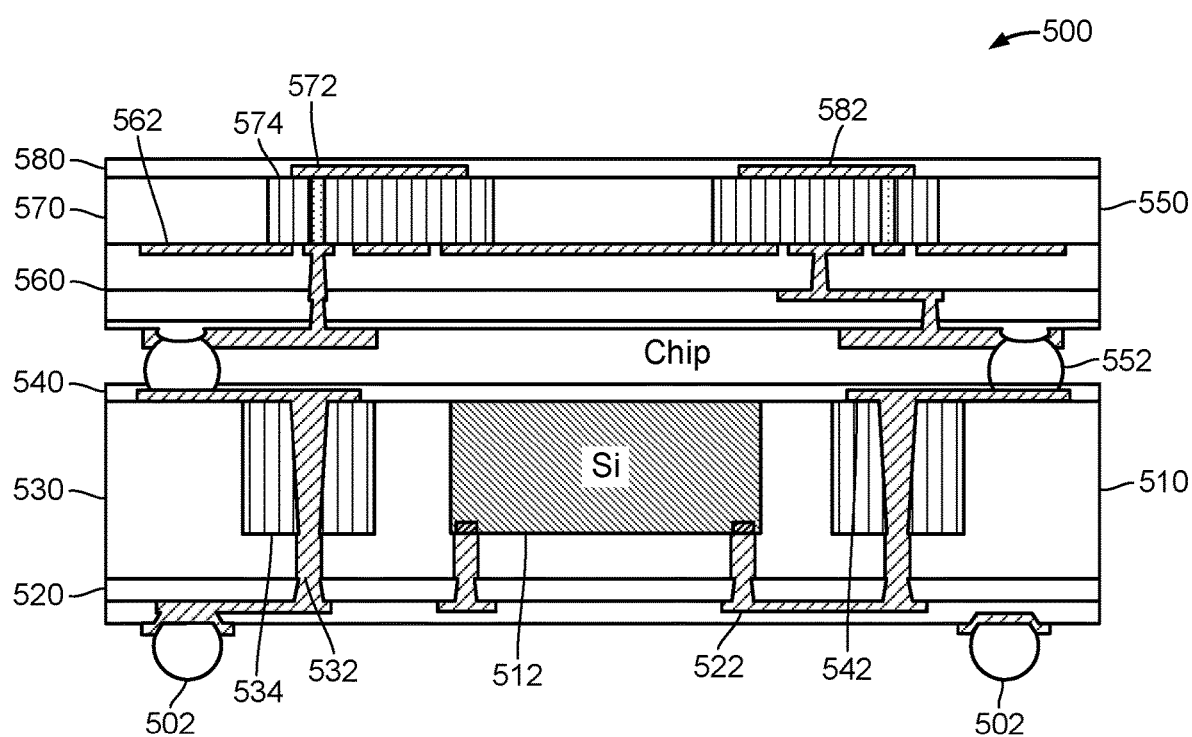
FIG. 5 generally illustrates yet another AOP arrangement in accordance with aspects of the disclosure.

FIG. 5 generally illustrates another AOP package 500 in accordance with aspects of the disclosure. The AOP package 500 may include a fanout panel package 510. The fanout panel package 510 may be similar in some respects to the fanout panel package 210 depicted in FIG. 2. In particular, the fanout panel package 510 may include one or more AOP contacts 502 analogous to the AOP contacts 202, a die 512 analogous to the die 212, a redistribution layer 520 and redistribution traces 522 analogous to the redistribution layer 220 and redistribution traces 222, respectively, a mold layer 530 analogous to the mold layer 230, and a through via 532 and a LLM insert 534 analogous to the through via 232 and the LLM insert 234, respectively. The AOP package 500 may further include a fanout panel package top layer 540 including traces 542 that is analogous in some respects to the fanout panel package top layer 440 including traces 442 depicted in FIG. 4. The AOP package 500 may further include an antenna package 550.

The antenna package 250, antenna package 350, and/or antenna package 450 depicted in FIGS. 2-4 may be fabricated in accordance with a printed circuit board (PCB) process, as will be discussed in greater detail below with reference to FIGS. 11A-11D. By contrast, the antenna package 550 depicted in FIG. 5 may be fabricated in accordance with an Embedded Wafer Level Ball Grid Array (eWLB) process, as will be discussed in greater detail below with respect to FIG. 12A-12J.

Like the antenna package 350 and antenna package 450, the antenna package 550 depicted in FIG. 5 may incorporate LLM. In particular, the antenna package 550 may include one or more antenna package contacts 552, an antenna package bottom layer 560, an antenna package substrate 570, and an antenna package top layer 580. The antenna package bottom layer 560 may have one or more sublayers and may include antenna bottom traces 562 extending vertically through the antenna package bottom layer 560 and/or horizontally on one of the sublayers. The antenna package substrate 570 may include a through via 572 and a LLM insert 574. The through via 572 may extend through the LLM insert 574, thereby reducing loss. The antenna bottom traces 562 and/or the antenna top traces 582 may be configured to jointly or individually transmit and/or receive electromagnetic radiation. The antenna bottom traces 562 and/or the antenna top traces 582 may be formed as a patch antenna. At least a portion of the antenna bottom traces 562 and/or the antenna top traces 582 may be disposed on the LLM insert 574, thereby reducing loss. However, the antenna package substrate 570 may include molding compound or other lossy material in non-strategic areas.

Figure 6:
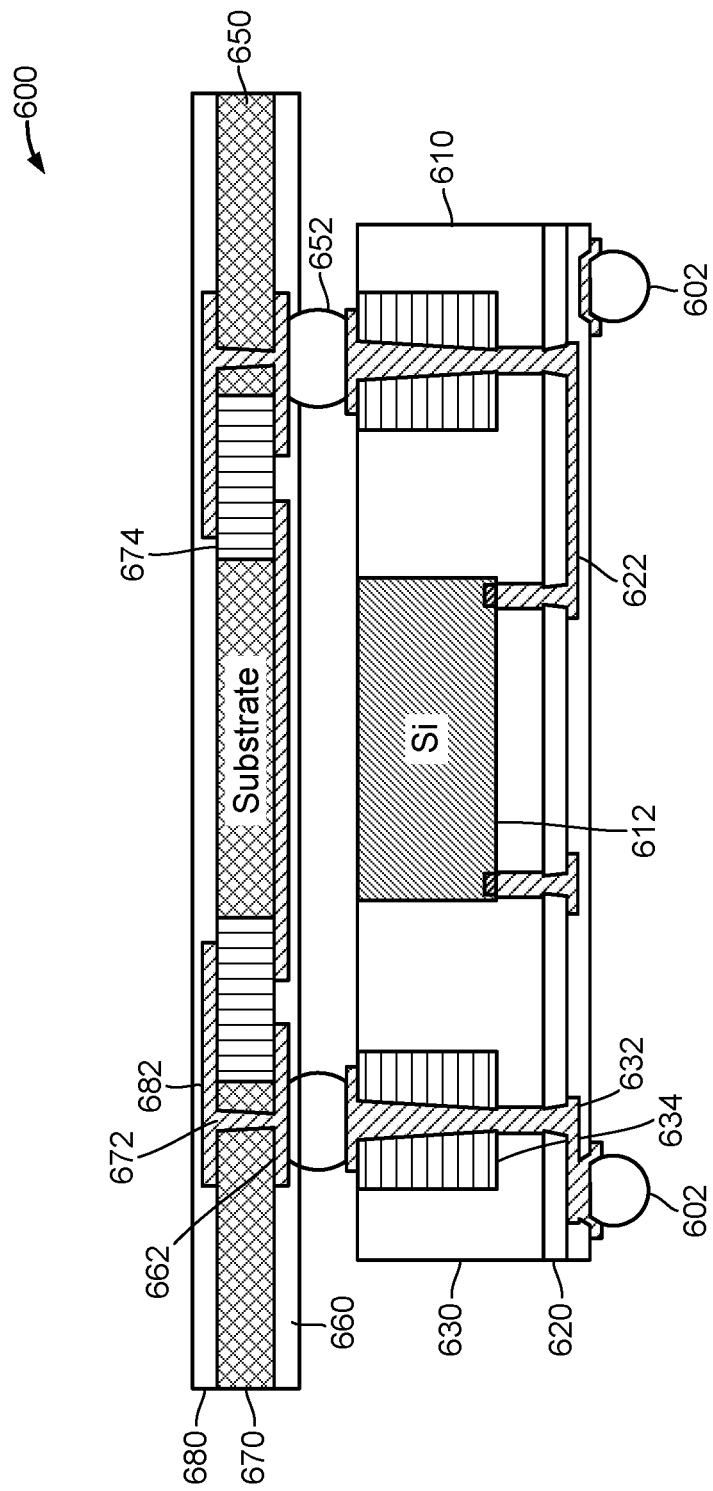
FIG. 6 generally illustrates yet another AOP arrangement in accordance with aspects of the disclosure.

FIG. 6 generally illustrates yet another AOP package 600 in accordance with aspects of the disclosure. The bottom package of the AOP package 600 (fanout panel package 610)

may be similar in some respects to the fanout panel package 210 depicted in FIG. 2. In particular, the AOP contact 602 is analogous to the AOP contact 202, the die 612 is analogous to the die 212, the redistribution layer 620 and mold layer 630 having an LLM insert 634 are analogous to the redistribution layer 220 and mold layer 230 having an LLM insert 234, respectively, and the redistribution traces 622 and through via 632 are analogous to the redistribution traces 222 and through via 232, respectively.

A size of the fanout panel package 610 depicted in FIG. 6 may differ from a size of the fanout panel package 210 depicted in FIG. 2. In particular, the fanout panel package 610 may have a smaller footprint than the fanout panel package 210. As will be understood from FIG. 6, it may not be possible to reduce the footprint of the antenna package 650. However, because the AOP package 600 is provided in an antenna-on-package arrangement, the fanout panel package 610 and the antenna package 650 need not be the same size. As a result, the AOP package 600 may have a full-size antenna package 650, but can be coupled to, for example, a printed circuit board in accordance with the smaller footprint of the fanout panel package 610. The top package of the AOP package 600 (antenna package 650) may be similar in some respects to the antenna package 450 depicted in FIG. 4. In particular, antenna package contacts 652 may be analogous to the antenna package contacts 452, an antenna package bottom layer 660, an antenna package substrate 670, and an antenna package top layer 680 may be analogous to the antenna package bottom layer 460, the antenna package substrate 470, and the antenna package top layer 480, respectively, the antenna bottom traces 662 and antenna top traces 682 may be analogous to the antenna bottom traces 462 and antenna top traces 482, respectively, and a through via 672 and a LLM insert 674 may be analogous to the through via 472 and LLM insert 474.

Figure 7:
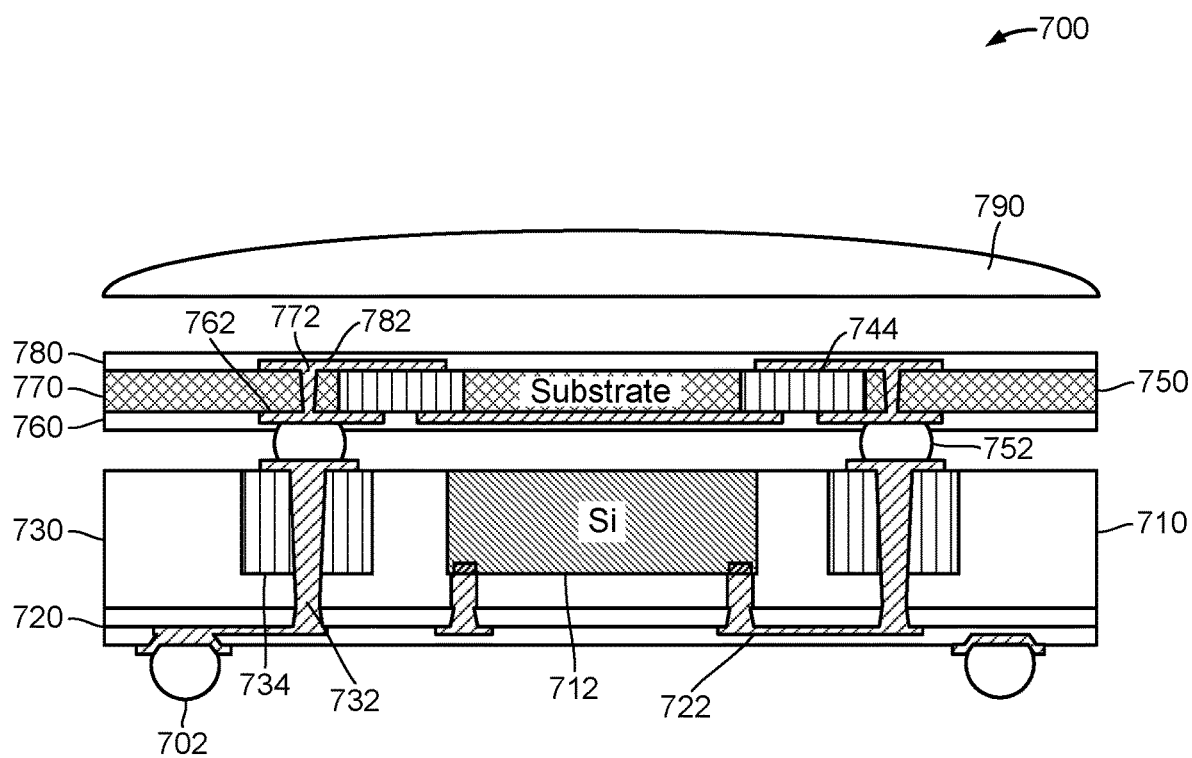
FIG. 7 generally illustrates yet another AOP arrangement including a lens in accordance with aspects of the disclosure.

FIG. 7 generally illustrates yet another AOP package 700 with a lens 790 in accordance with aspects of the disclosure. The bottom package of the AOP package 700 (fanout panel package 710) may be similar in some respects to the fanout panel package 610 depicted in FIG. 6. In particular, the AOP contact 702 is analogous to the AOP contact 602, the die 712 is analogous to the die 612, the redistribution layer 720 and mold layer 730 having an LLM insert 734 are analogous to the redistribution layer 620 and mold layer 630 having an LLM insert 634, respectively, and the redistribution traces 722 and through via 732 are analogous to the redistribution traces 622 and through via 632, respectively.

The top package of the AOP package 700 (antenna package 750) may be similar in some respects to the antenna package 650 depicted in FIG. 6. In particular, antenna package contacts 752 may be analogous to the antenna package contacts 652, an antenna package bottom layer 760, an antenna package substrate 770, and an antenna package top layer 780 may be analogous to the antenna package bottom layer 660, the antenna package substrate 670, and the antenna package top layer 680, respectively, the antenna bottom traces 762 and antenna top traces 782 may be analogous to the antenna bottom traces 662 and antenna top traces 682, respectively, and a through via 772 and a LLM insert 774 may be analogous to the through via 672 and LLM insert 674. The lens 790 may be configured to focus electromagnetic radiation that is transmitted from and/or received by the antenna package 650.

FIGS. 8A-8G generally illustrate at least a portion of a several-stage fabrication process for a fanout panel package 810. The fanout panel package 810 may be further fabricated in accordance with FIG. 9 (resulting in a fanout panel package similar to the fanout panel package 210 depicted in FIG. 2). Alternatively, the fanout panel package 810 may be further fabricated in accordance with FIGS. 10A-10B (resulting in a fanout panel package similar to the fanout panel package 410 depicted in FIG. 4).

Figure 8A:
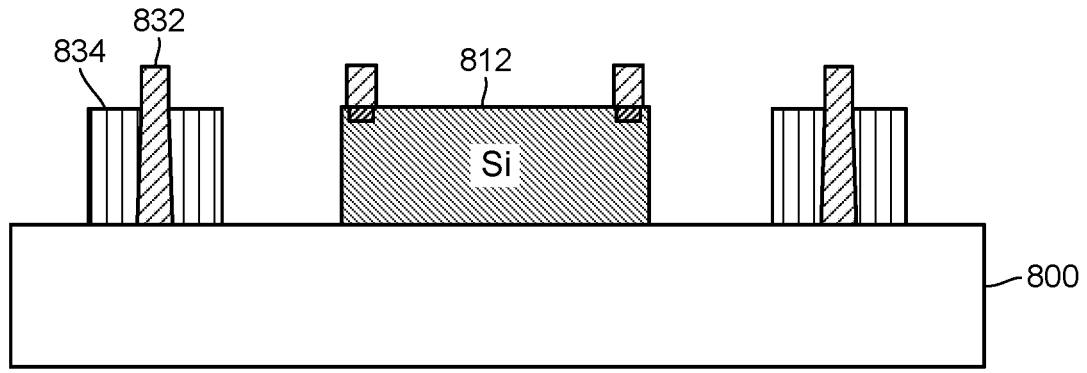
FIG. 8A generally illustrates a fanout panel package in a first stage of fabrication.

FIG. 8A generally illustrates a fanout panel package 810 in a first stage of fabrication. In FIG. 8A, a die 812, a through via 832, and a LLM insert 834 are disposed on a carrier 800.

Figure 8B:
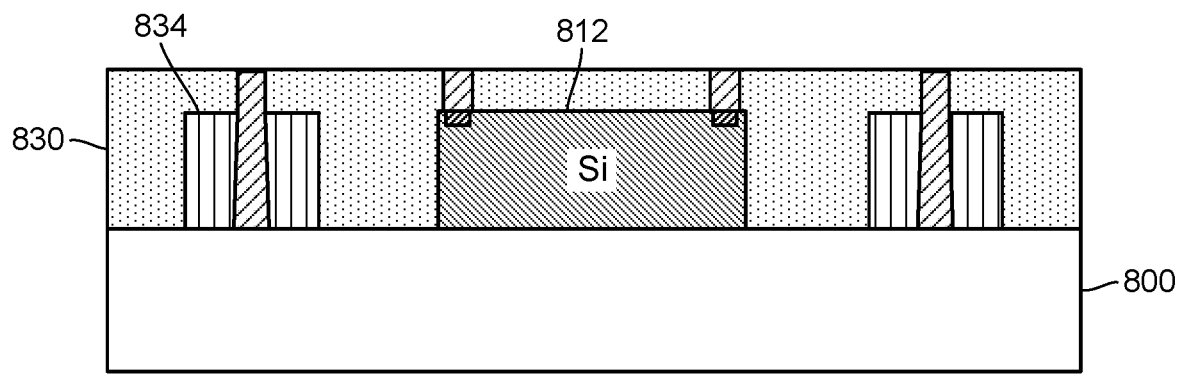
FIG. 8B generally illustrates a fanout panel package in a second stage of fabrication.

FIG. 8B generally illustrates a fanout panel package 810 in a second stage of fabrication. In FIG. 8B, a mold layer 830 is disposed over the top of the die 812, the through via 832, and the LLM insert 834. In some implementations, the mold layer 830 may be polished back in order to expose the surface of the through via 832 and/or the contacts of the die 812. After the stage depicted in FIG. 8B, fabrication of the mold layer 830 may be complete. The completed mold layer 830 may be analogous to the mold layer 230 depicted in FIG. 2 and/or the mold layer 430 depicted in FIG. 4.

Figure 8C:
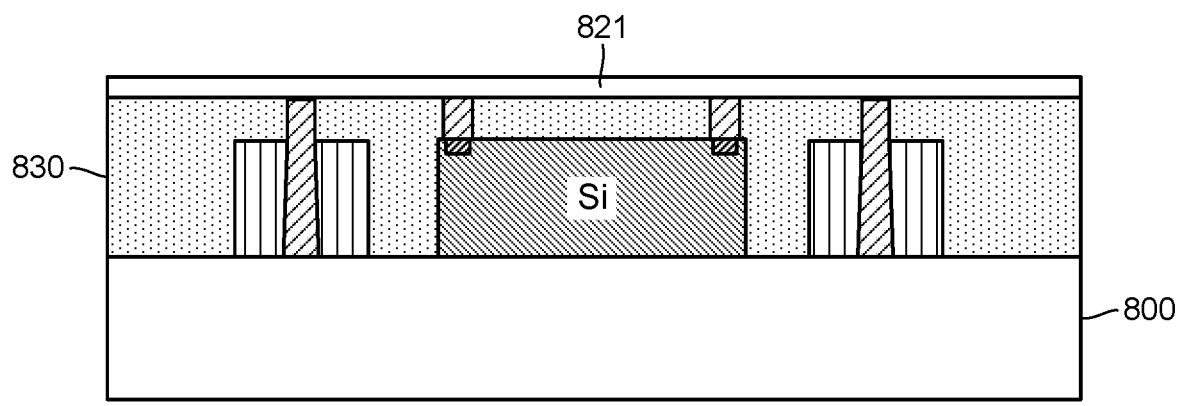
FIG. 8C generally illustrates a fanout panel package in a third stage of fabrication.

FIG. 8C generally illustrates a fanout panel package 810 in a third stage of fabrication. In FIG. 8C, a first redistribution layer 821, for example, a dielectric layer comprising a laminate, is disposed on the mold layer 830. Photolithography may be used to create passages in the first redistribution layer 821, which may then be filled with conductive material.

Figure 8D:
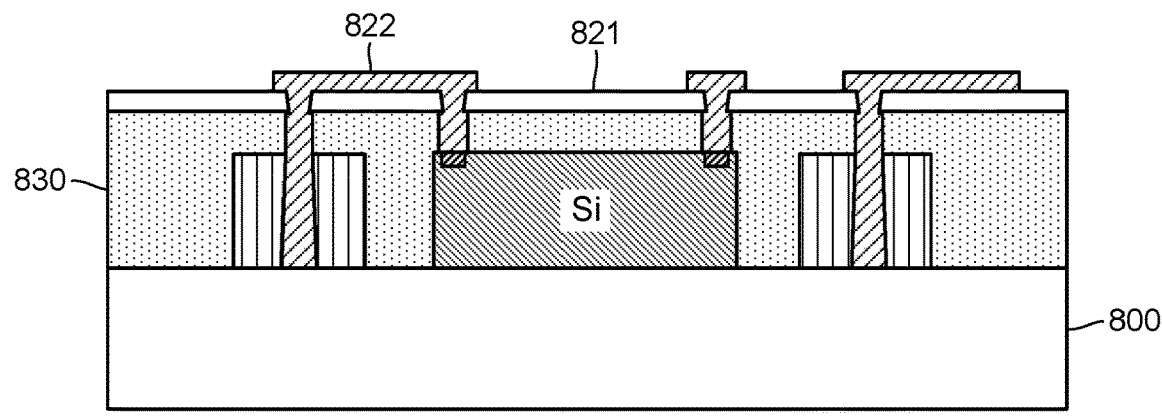
FIG. 8D generally illustrates a fanout panel package in a fourth stage of fabrication.

FIG. 8D generally illustrates a fanout panel package 810 in a fourth stage of fabrication. In FIG. 8D, first redistribution traces 822 are disposed on the first redistribution layer 821. The first redistribution traces 822 may be formed using, for example, copper plating.

Figure 8E:
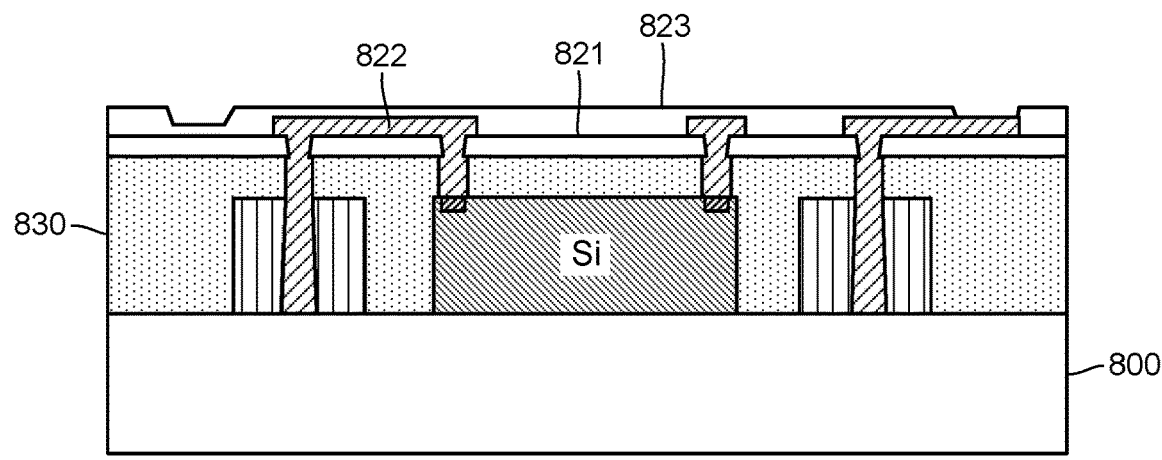
FIG. 8E generally illustrates a fanout panel package in a fifth stage of fabrication.

FIG. 8E generally illustrates a fanout panel package 810 in a fifth stage of fabrication. In FIG. 8E, a second redistribution layer 823, for example, a dielectric layer comprising a laminate, is disposed on the first redistribution layer 821 and first redistribution traces 822. Photolithography may be used to create passages in the second redistribution layer 823, which may then be filled with conductive material.

Figure 8F:
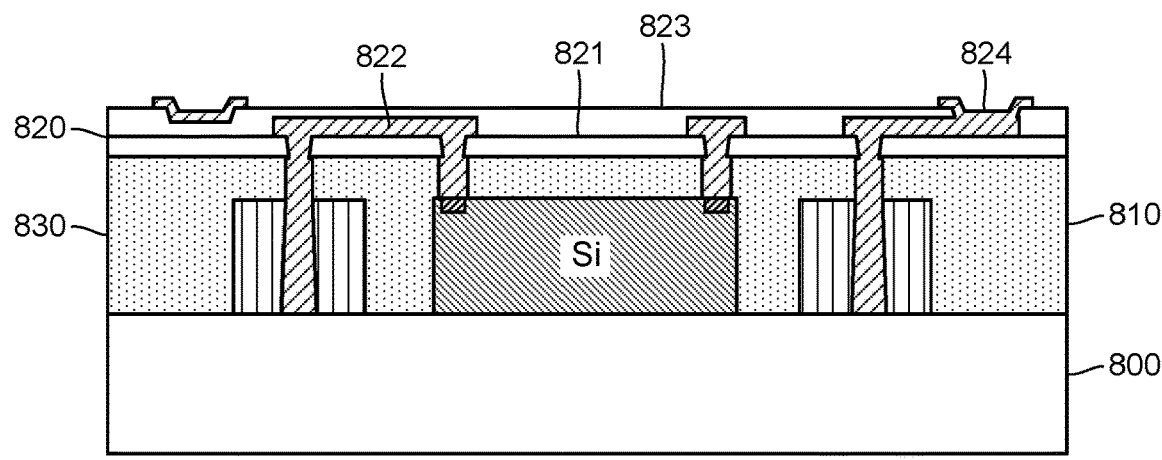
FIG. 8F generally illustrates a fanout panel package in a sixth stage of fabrication.

FIG. 8F generally illustrates a fanout panel package 810 in a sixth stage of fabrication. In FIG. 8F, second redistribution traces 824 are disposed on the second redistribution layer 823. The second redistribution traces 824 may be formed using, for example, copper plating. After the stage depicted in FIG. 8F, fabrication of the redistribution layer 820 may be complete. The completed redistribution layer 820 may be analogous to the redistribution layer 220 depicted in FIG. 2 and/or the redistribution layer 420 depicted in FIG. 4.

Figure 8G:
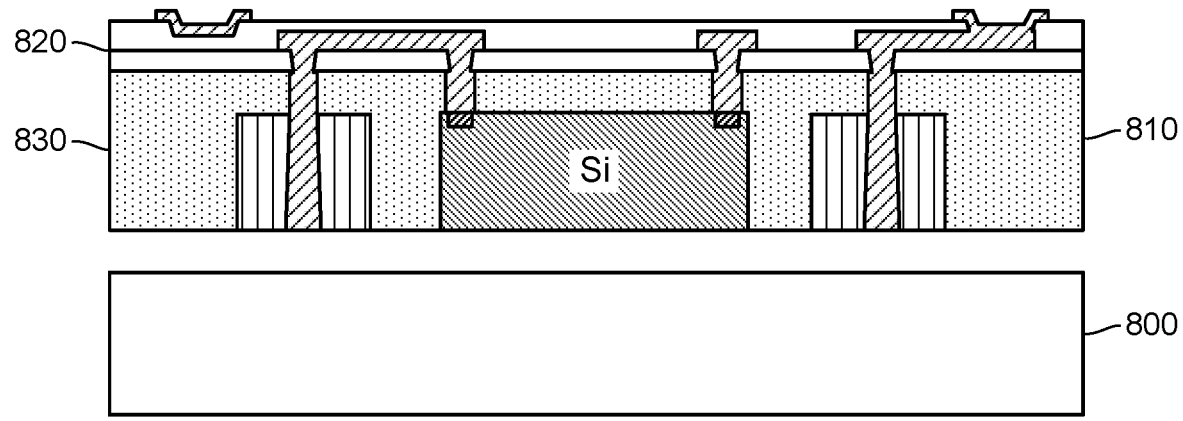
FIG. 8G generally illustrates a fanout panel package in a seventh stage of fabrication.

FIG. 8G generally illustrates a fanout panel package 810 in a seventh stage of fabrication. In FIG. 8G, the fanout panel package 810 is removed from the carrier 800.

Figure 9:
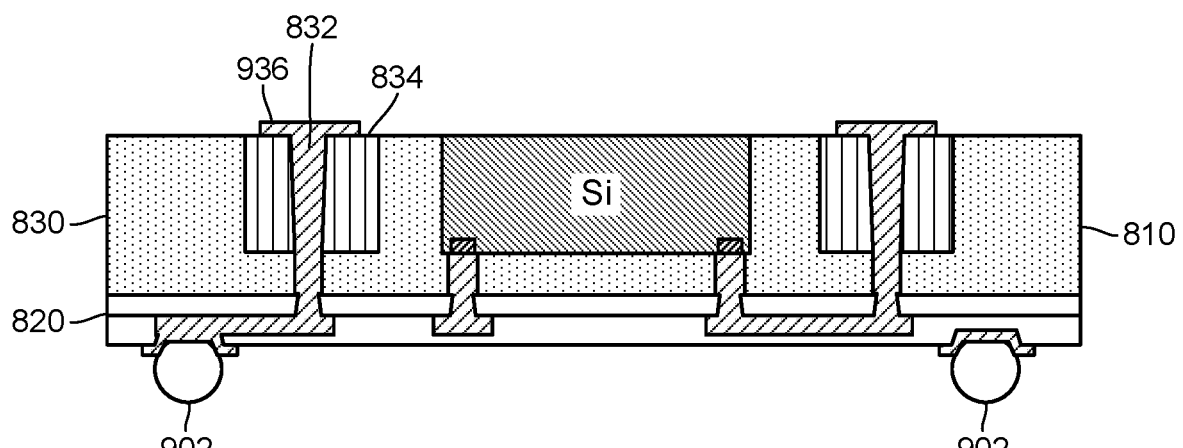
FIG. 9 generally illustrates the fanout panel package of FIG. 8G in a subsequent stage of fabrication.

FIG. 9 generally illustrates the fanout panel package 810 of FIG. 8G in a further stage of fabrication. As will be understood from FIG. 9, the fanout panel package 810 has flipped in a vertical direction such that the mold layer 830 is on top and the redistribution layer 820 is on the bottom. One or more AOP contacts 902 have been disposed on the second redistribution traces 824. Moreover, a contact pad 936 is disposed on the through via 832 and/or at least a portion of the LLM insert 834. It will be understood that by completing each of the stages depicted in FIGS. 8A-8G and 9, a fanout panel package analogous to the fanout panel package 210 depicted in FIG. 2 may be fabricated.

Figure 10A:
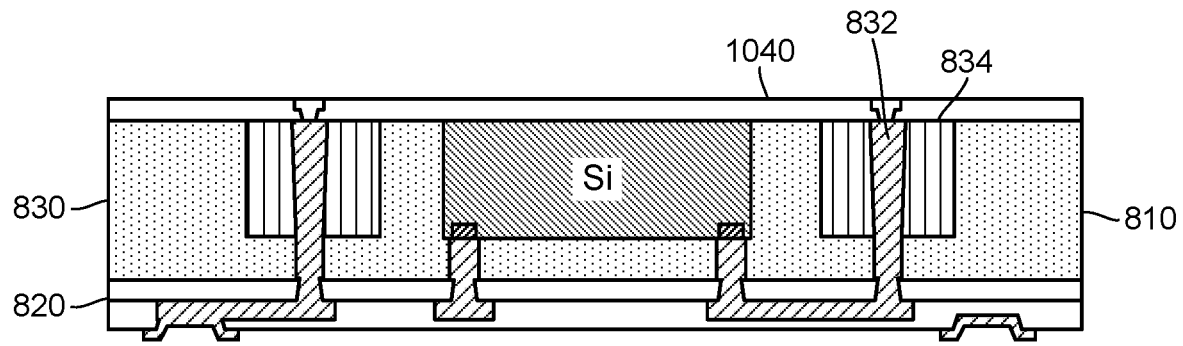
FIG. 10A generally illustrates the fanout panel package of FIG. 8G in an alternative subsequent stage of fabrication.
Figure 10B:
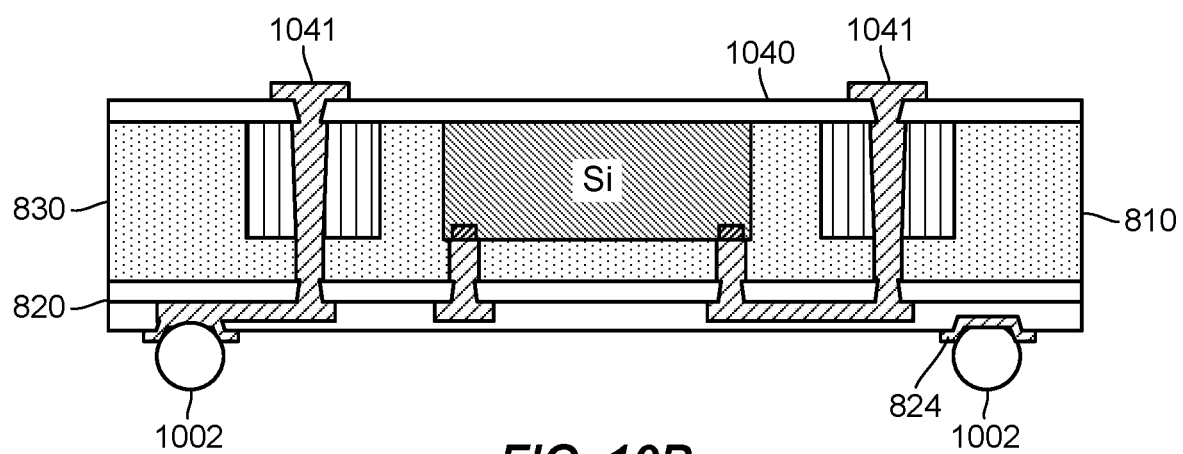
FIG. 10B generally illustrates the fanout panel package of FIG. 10A in a subsequent stage of fabrication.

FIGS. 10A-10B generally illustrate two stages that may serve as an alternative to the final stage of FIG. 9. In particular, by completing each of the stages depicted in FIGS. 8A-8G and 10A-10B, a fanout panel package analogous to the fanout panel package 410 depicted in FIG. 4 may be fabricated.

FIG. 10A generally illustrates the AOP package of FIG. 8G in a subsequent stage of fabrication. In FIG. 10A, a fanout panel package top layer 1040 is disposed on the mold layer 830. Photolithography may be used to create passages in the fanout panel package top layer 1040, which may then be filled with conductive material.

FIG. 10B generally illustrates the AOP package of FIG. 10A in a subsequent stage of fabrication. In FIG. 10B, contact pads 1041 are disposed on the fanout panel package top layer 1040 and AOP contacts 1002 are disposed on the second redistribution traces 824.

Figure 11A:
FIG. 11A generally illustrates an antenna package in a first stage of fabrication.

FIG. 11A generally illustrates an antenna package in a first stage of fabrication. In FIG. 11A, an antenna package substrate 1170 is provided. The antenna package substrate 1170 includes a through via 1172 and a LLM insert 1174. The through via 1172 and the LLM insert 1174 traverse the antenna package substrate 1170 in a vertical direction. The through via 1172 may be formed by drilling a hole in the antenna package substrate 1170 and filling the hole with conductive material. The LLM insert 1174 may be formed by providing the antenna package substrate 1170, creating a hole in the antenna package substrate 1170, and then inserting or embedding the LLM insert 1174 into the hole. Alternatively, the LLM insert 1174 may be provided and placed and the antenna package substrate 1170 may be provided around the LLM insert 1174.

Figure 11B:
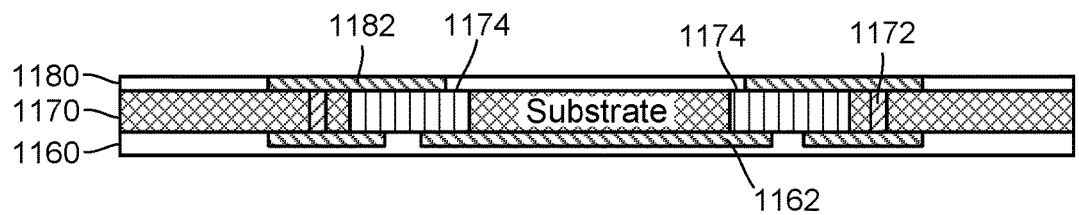
FIG. 11B generally illustrates an antenna package in a second stage of fabrication.

FIG. 11B generally illustrates an antenna package in a second stage of fabrication. In FIG. 11B, an antenna package bottom layer 1160 and an antenna package top layer 1180 are provided on a bottom and top, respectively, of the antenna package substrate 1170. The antenna package bottom layer 1160 may comprise antenna bottom traces 1162 and the antenna package top layer 1180 may comprise antenna top traces 1182. The antenna bottom traces 1162 and the antenna top traces 1182 may be formed by plating a surface of the antenna package substrate 1170 with copper or other suitable conductive material. A dielectric layer may be provided around the copper-plated portions.

Figure 11C:
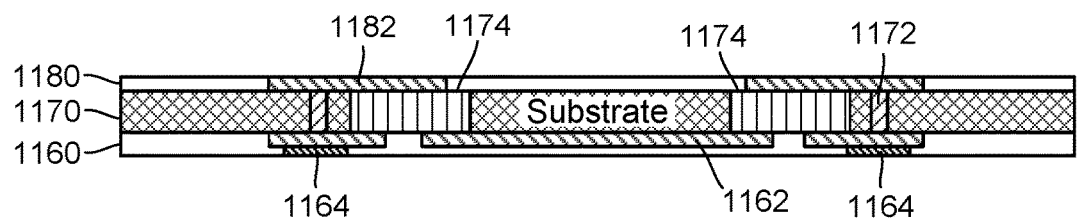
FIG. 11C generally illustrates an antenna package in a third stage of fabrication.

FIG. 11C generally illustrates an antenna package in a third stage of fabrication. In FIG. 11C, a dielectric layer 1163 comprising, for example, laminate is added to a surface that includes the antenna bottom traces 1162 and/or a dielectric layer surrounding the antenna bottom traces 1162. A dielectric layer 1183 may be added to the antenna top traces 1182 and/or a dielectric layer surrounding the antenna top traces 1182. Moreover, a contact pad 1164 is added to the antenna package bottom layer 1160. The contact pad 1164 may traverse the laminate layer depicted in FIG. 11C in a vertical direction, and may couple the antenna bottom traces 1162 to an outer surface of the antenna package 1150.

Figure 11D:
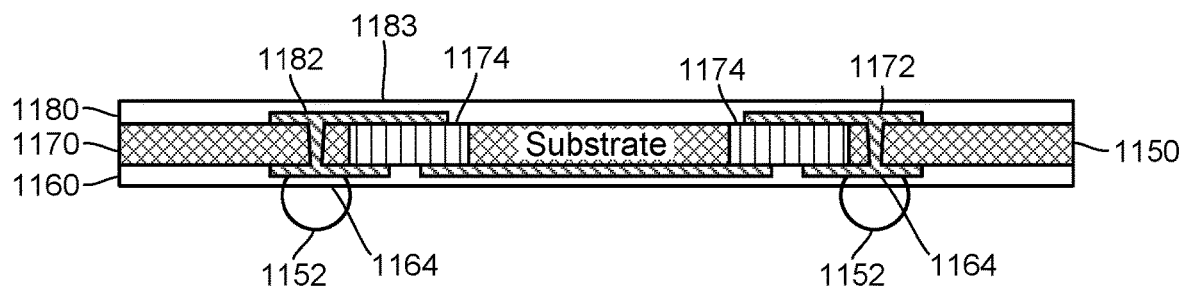
FIG. 11D generally illustrates an antenna package in a fourth stage of fabrication.

FIG. 11D generally illustrates an antenna package in a fourth stage of fabrication. In FIG. 11D, an antenna package contact 1152 is placed on the contact pad 1164.

The fabrication process depicted in FIGS. 11A-11C may be used to fabricate the antenna package 350 depicted in FIG. 3, the antenna package 450 depicted in FIG. 4, and/or the antenna package 650 depicted in FIG. 6. The fabrication process depicted in FIGS. 11A-11C may be used to fabricate the antenna package 250 depicted in FIG. 2 by omitting the LLM insert 1174.

Figure 12A:
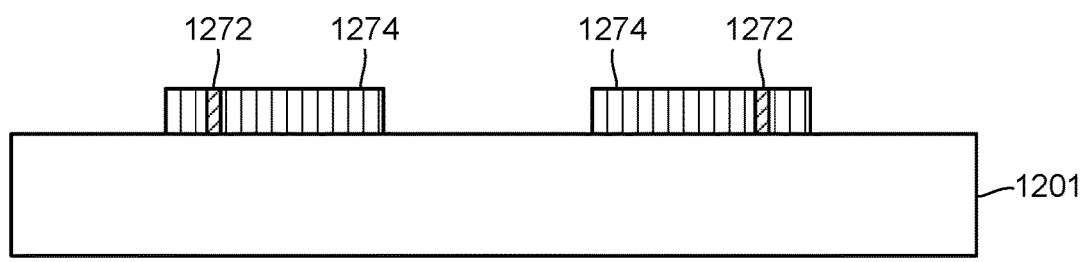
FIG. 12A generally illustrates an antenna package in a first stage of fabrication.

FIG. 12A generally illustrates an antenna package in a first stage of fabrication. In FIG. 12A, a first carrier 1201 is provided and a through via 1272 (for example, a through-insert via) and a LLM insert 1274 are placed on the first carrier 1201.

Figure 12B:
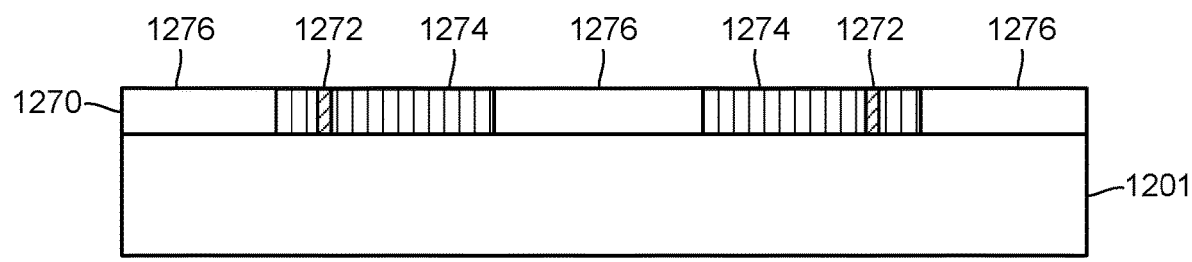
FIG. 12B generally illustrates an antenna package in a second stage of fabrication.

FIG. 12B generally illustrates an antenna package in a second stage of fabrication, in which an antenna package substrate 1270 is completed. In FIG. 12B, a mold 1276 is provided on the uncovered portions of the first carrier 1201. Alternatively, the mold 1276 may be provided over the first carrier 1201, the through via 1272, and the LLM insert 1274, and then the mold 1276 may be polished back until the through via 1272 and LLM insert 1274 are exposed. The through via 1272, the LLM insert 1274, and the mold 1276 may constitute the completed antenna package substrate 1270.

Figure 12C:
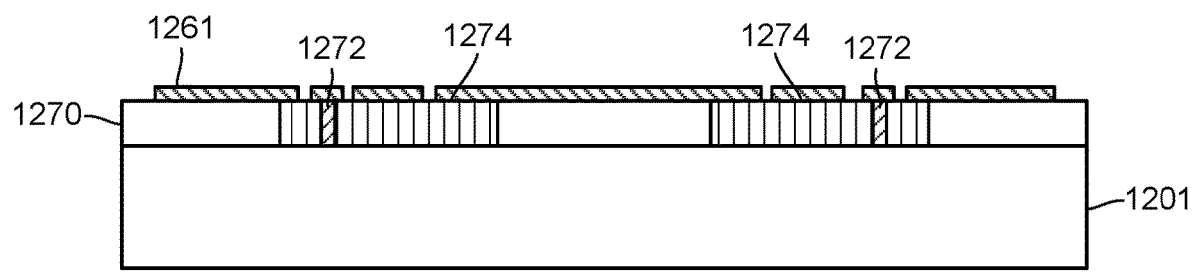
FIG. 12C generally illustrates an antenna package in a third stage of fabrication.

FIG. 12C generally illustrates an antenna package in a third stage of fabrication. In FIG. 12C, first antenna bottom traces 1261 are disposed on a surface of the antenna package substrate 1270, for example, on a surface of the through via 1272, the LLM insert 1274, and/or the mold 1276 (or respective portions thereof). The first antenna bottom traces 1261 may be formed using, for example, copper plating.

Figure 12D:
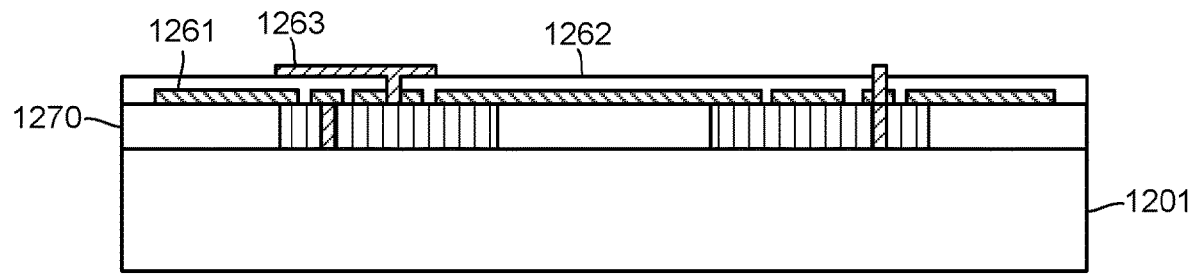
FIG. 12D generally illustrates an antenna package in a fourth stage of fabrication.

FIG. 12D generally illustrates an antenna package in a fourth stage of fabrication. In FIG. 12D, a first antenna package bottom sublayer 1262 covers the first antenna bottom traces 1261 as well as the exposed portions of the antenna package substrate 1270. The first antenna package bottom sublayer 1262 may be provided by coating the first antenna bottom traces 1261, etc., with laminate or some other dielectric material. Second antenna bottom traces 1263 are disposed on the first antenna package bottom sublayer 1262. The second antenna bottom traces 1263 may be formed using, for example, copper plating. The first antenna package bottom sublayer 1262 may include through vias formed using, for example, photolithography. Accordingly, the second antenna bottom traces 1263 may fill the vias such that the second antenna bottom traces 1263 are coupled to the first antenna bottom traces 1261.

Figure 12E:
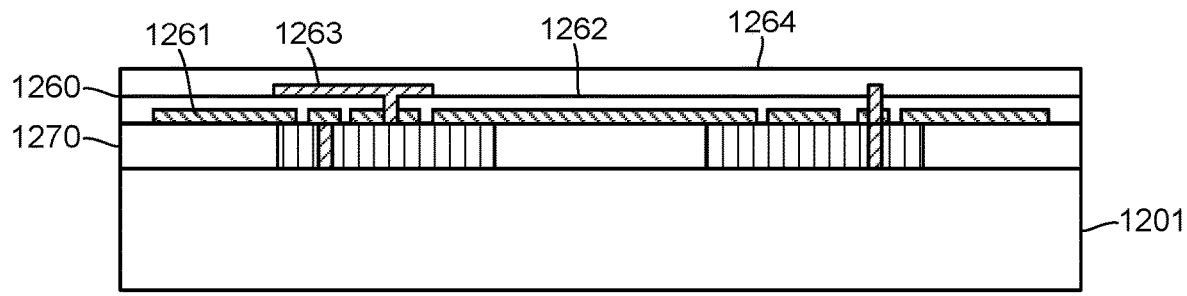
FIG. 12E generally illustrates an antenna package in a fifth stage of fabrication.

FIG. 12E generally illustrates an antenna package in a fifth stage of fabrication. In FIG. 12E, a second antenna package bottom sublayer 1264 covers the second antenna bottom traces 1263 as well as the exposed portions of the antenna package substrate first antenna package bottom sublayer 1262. The second antenna package bottom sublayer 1264 may be provided by coating the second antenna bottom traces 1263, etc., with laminate or some other dielectric material.

Figure 12F:
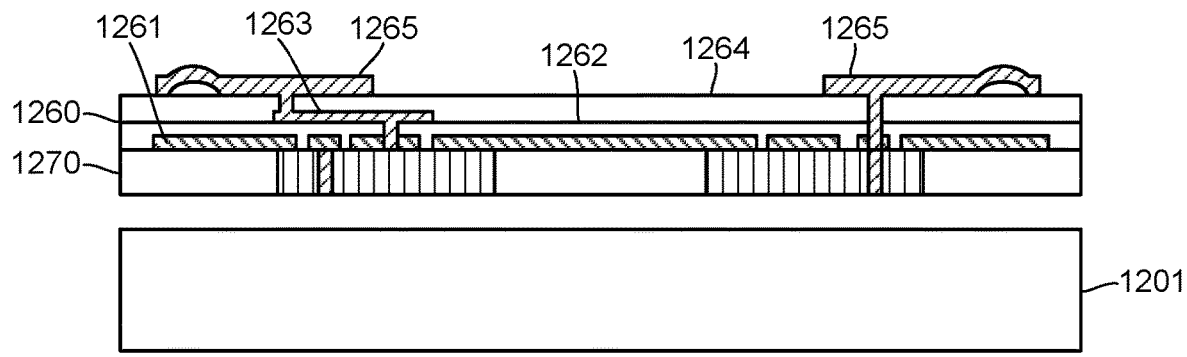
FIG. 12F generally illustrates an antenna package in a sixth stage of fabrication.

FIG. 12F generally illustrates an antenna package in a sixth stage of fabrication, in which the first antenna package bottom layer 1260 is completed. In FIG. 12F, contact pads 1265 are disposed on the second antenna package bottom sublayer 1264. The contact pads 1265 may be formed using, for example, copper plating. The second antenna package bottom sublayer 1264 may include through vias formed using, for example, photolithography. Accordingly, the contact pads 1265 may fill the vias such that the contact pads 1265 are coupled to the second antenna bottom traces 1263. The first antenna bottom traces 1261, the first antenna package bottom sublayer 1262, the second antenna bottom traces 1263, the second antenna package bottom sublayer 1264, and the contact pads 1265 may constitute the completed first antenna package bottom layer 1260. The completed first antenna package bottom layer 1260 may be removed from the first carrier 1201. Although two sublayers of the first antenna package bottom layer 1260 are depicted in FIG. 12F, it will be understood that the first antenna package bottom layer 1260 may include any number of sublayer, for example, one sublayer or three or more sublayers.

Figure 12G:
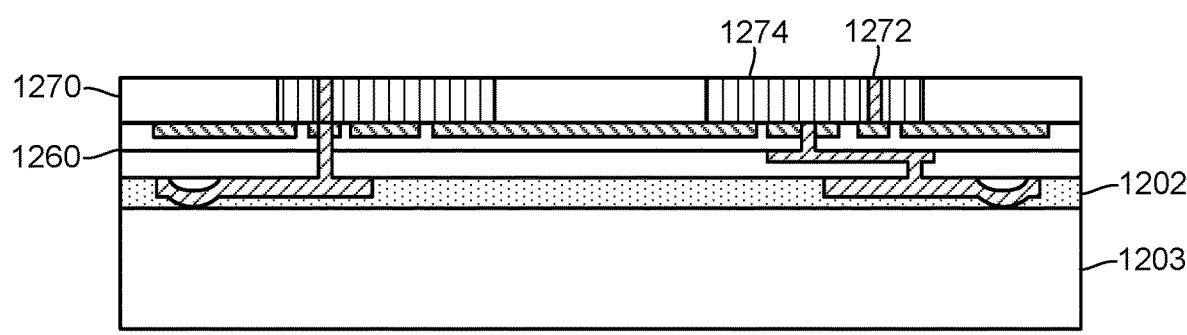
FIG. 12G generally illustrates an antenna package in a seventh stage of fabrication.

FIG. 12G generally illustrates an antenna package in a seventh stage of fabrication. In FIG. 12G, a carrier adhesion layer 1202 has been added to the first antenna package bottom layer 1260. The carrier adhesion layer 1202 may have a flat shape to complement the flat shape of a second carrier 1203. The antenna package substrate 1270, the first antenna package bottom layer 1260, and the carrier adhesion layer 1202 may be flipped and placed on the second carrier 1203.

Figure 12H:
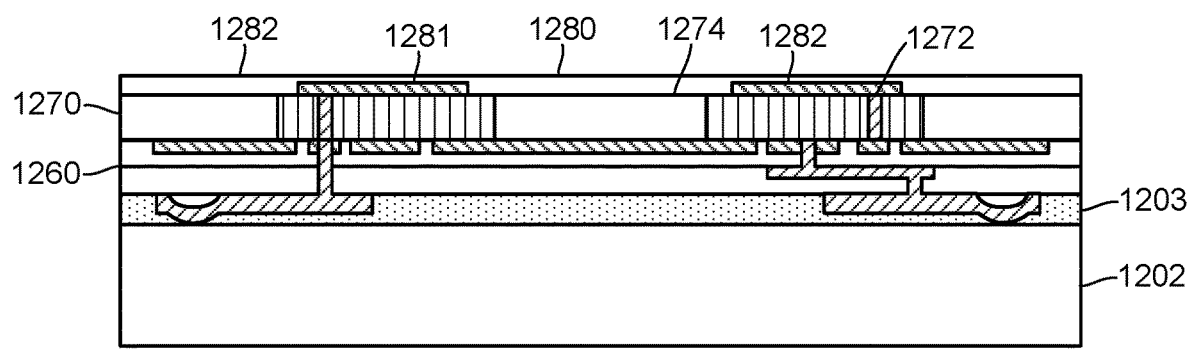
FIG. 12H generally illustrates an antenna package in a eighth stage of fabrication.

FIG. 12H generally illustrates an antenna package in an eighth stage of fabrication. In FIG. 12H, an antenna package top layer 1280 has been provided on the antenna package substrate 1270. The antenna package substrate 1270 may include antenna top traces 1281 and a mold 1282.

Figure 12I:
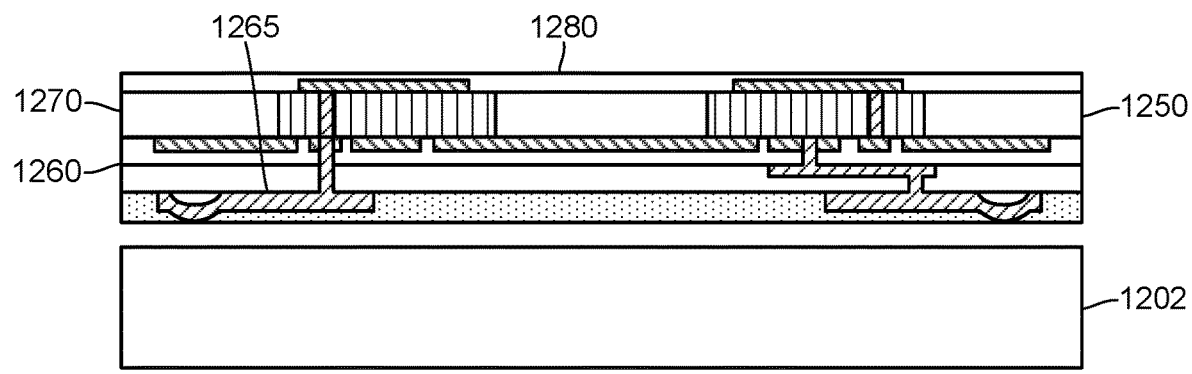
FIG. 12I generally illustrates an antenna package in a ninth stage of fabrication.

FIG. 12I generally illustrates an antenna package in a ninth stage of fabrication. In FIG. 12I, the second carrier 1203 is removed, for example, melted or dissolved, which may detach the antenna package 1250 from the carrier adhesion layer 1202. The first antenna package bottom layer 1260, the antenna package substrate 1270, and the antenna package top layer 1280 may constitute a completed antenna package 1250.

Figure 12J:
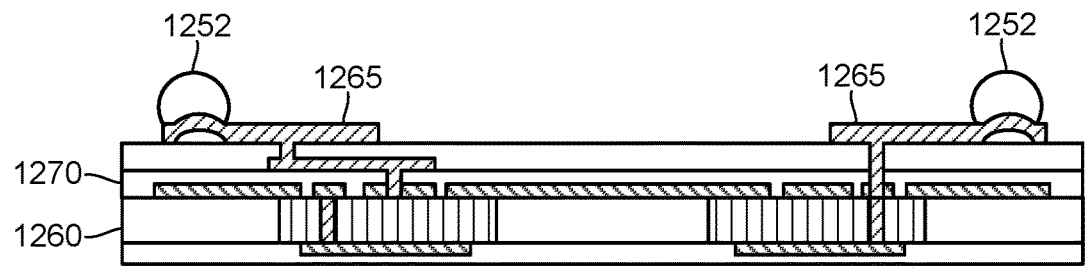
FIG. 12J generally illustrates an antenna package in a tenth stage of fabrication.

FIG. 12J generally illustrates an antenna package in a tenth stage of fabrication. In FIG. 12J, antenna package contacts 1252 are provided on the contact pads 1265.

The fabrication process depicted in FIGS. 12A-12J may be used to fabricate, for example, the antenna package 550 depicted in FIG. 5.

Figure 13:
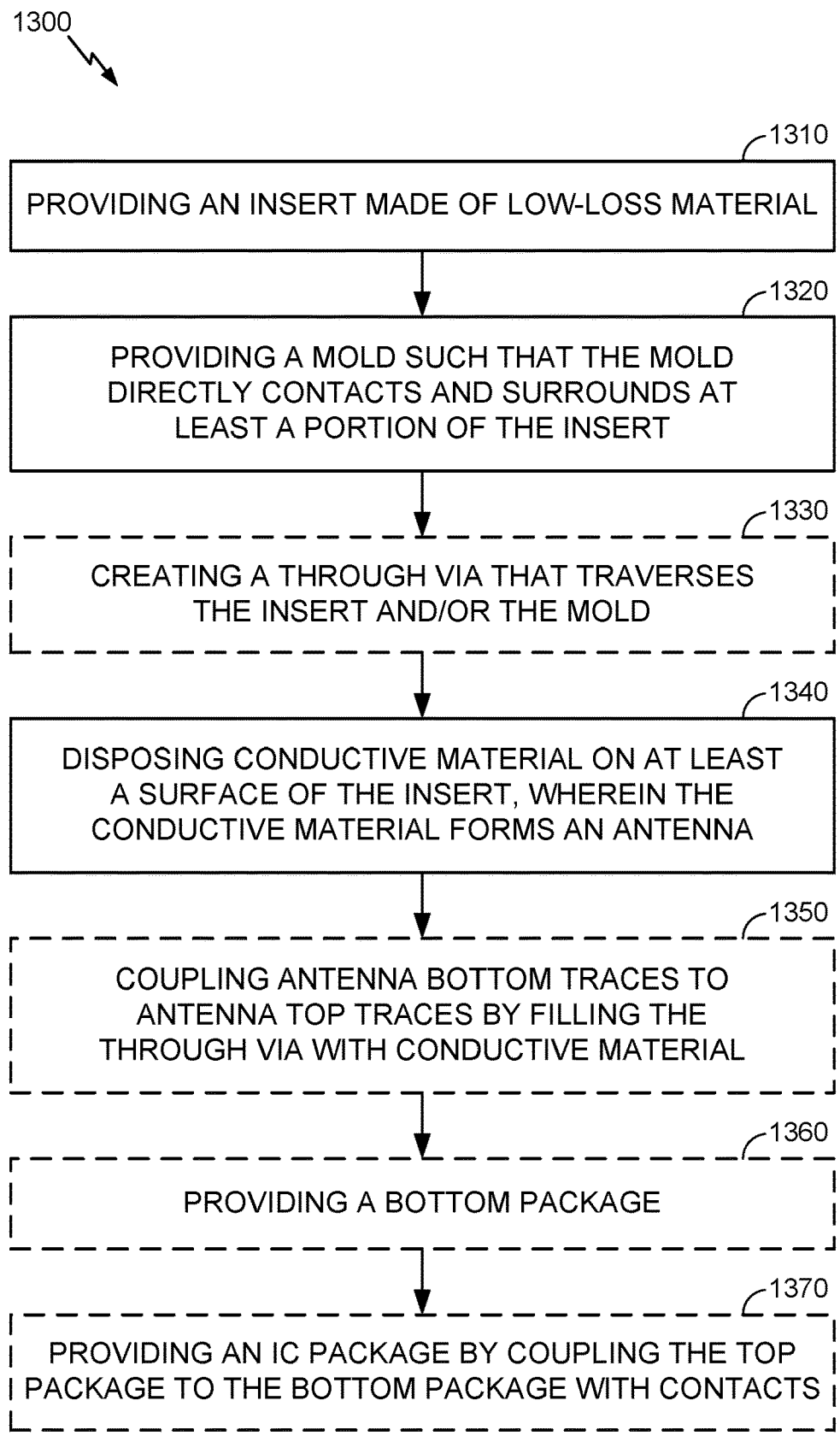
FIG. 13 generally illustrates a method for fabricating an AOP package in accordance with aspects of the disclosure.

FIG. 13 generally illustrates a method 1300 for fabricating a package in accordance with aspects of the disclosure. At 1310, the method 1300 provides an insert made of low-loss material. In some implementations, the low-loss material comprises one or more of glass, synthetic quartz, organic laminate, and ceramic.

At 1320, the method 1300 provides a mold such that the mold directly contacts and surrounds at least a portion of the insert. In some implementations, the providing of the mold comprises providing the mold such that the mold contacts the insert and surrounds a periphery of the insert. In some implementations, the mold comprises molding compound. At 1330, the method 1300 optionally creates a through via that traverses the insert and/or the mold.

At 1340, the method 1300 disposes (for example, deposits) conductive material on at least a surface of the insert, wherein the conductive material forms an antenna. In some implementations, the antenna is a patch antenna. In some implementations, the disposing of the conductive material comprises disposing antenna bottom traces at least in part on a bottom surface of the insert and/or disposing antenna top traces at least in part on a top surface of the insert. In some implementations, the antenna, the insert, and the mold constitute a top package.

At 1350, the method 1300 optionally couples the antenna bottom traces to the antenna top traces by filling the through via with conductive material. At 1360, the method 1300 optionally provides a bottom package. In some implementations, providing the bottom package comprises providing a die in the bottom package and coupling the top package to the die with a through via, in some implementations, providing the bottom package further comprises providing the bottom package such that the through via is in contact with a second insert made of low-loss material.

At 1370, the method 1300 optionally provides a package by coupling the top package to the bottom package with contacts.

Figure 14:
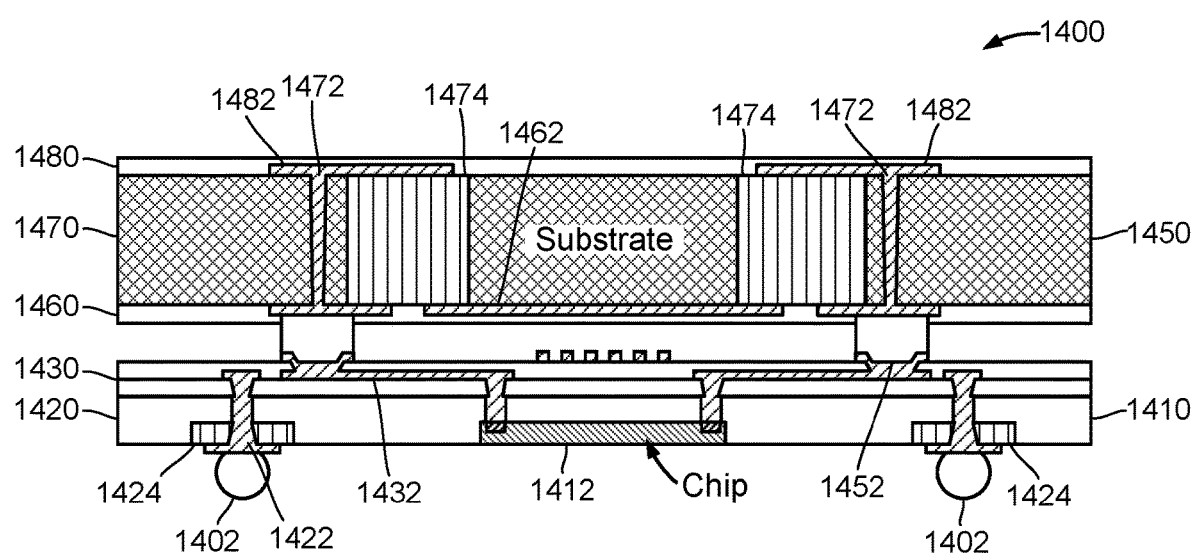
FIG. 14 generally illustrates yet another AOP arrangement in accordance with aspects of the disclosure

FIG. 14 generally illustrates an AOP package 1400 in accordance with aspects of the disclosure. The top package of the AOP package 1400 is similar to the top package of the AOP package 300. In particular, the antenna package 1450 is analogous to the antenna package 350, the antenna package bottom layer 1460, antenna package substrate 1470, and antenna package top layer 1480 are analogous to the antenna package bottom layer 360, antenna package substrate 370, and antenna package top layer 380, respectively, and the antenna bottom traces 1462, antenna top traces 1482, through via 1472, and LLM insert 1474 are analogous to the antenna bottom traces 362, antenna top traces 382, through via 372, and LLM insert 374, respectively. However, unlike the top package of the AOP arrangement 300 (which has contact 352), the AOP arrangement 1400 includes antenna package redistribution layer contacts 1452.

The bottom package of the AOP package 1400 (the fanout panel package 1410) may be similar in some respects to the fanout panel package 310 depicted in FIG. 3. In particular, an AOP contact 1402 is analogous to the AOP contact 302, a die 1412 is analogous to the die 312, a redistribution layer 1420 and a mold layer 1430 are analogous to the redistribution layer 320 and the mold layer 330, respectively, and redistribution traces 1422 and through via 1432 are analogous to the redistribution traces 322 and through via 332, respectively.

The elements set forth above may be configured to perform particular functions, and may likewise constitute means for performing those particular functions. For example, the antenna package 250, the antenna package 350, the antenna package 450, the antenna package 550, the antenna package 650, and/or the antenna package 750 may constitute means for transmitting and receiving electromagnetic radiation. Alternatively, the antenna bottom traces 262, antenna top traces 282, antenna bottom traces 362, antenna top traces 382, antenna bottom traces 462, antenna top traces 482, antenna bottom traces 562, antenna top traces 582, antenna bottom traces 662 and/or antenna top traces 682 may constitute means for transmitting and receiving electromagnetic radiation.

Moreover, the LLM insert 234, the LLM insert 374, the LLM insert 474, the LLM insert 534, the LLM insert 574, the LLM insert 634, and/or the LLM insert 674 may constitute means for reducing dielectric loss. The antenna package substrate 270, the antenna package substrate 370, the antenna package substrate 470, the antenna package substrate 570, and/or the antenna package substrate 670 may constitute means for insulating conductive material. Means for insulating conductive material may suffer a first amount of dielectric loss for a given current and/or frequency, whereas means for reducing dielectric loss may suffer a second amount of dielectric loss smaller than the first amount of dielectric loss for the given current and/or frequency. The through via 232, the through via 272, the through via 322, the through via 372, the through via 432, the through via 472, the through via 532, the through via 572, the through via 632, and/or the through via 672 may constitute means for traversing, for example, means for reducing dielectric loss and/or means for insulating conductive material. The antenna package contacts 252, antenna package contacts 352, antenna package contacts 452, antenna package contacts 552, and/or antenna package contacts 652 may constitute means for coupling a top package to a bottom package. The die 212, the die 312, the die 412, the die 512, and/or the die 612 may constitute means for processing.

The terminology used herein is for the purpose of describing particular embodiments only and not to limit any embodiments disclosed herein. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, the phrase "based on" as used herein does not necessarily preclude influence of other factors and should be interpreted in all cases as "based at least in part on" rather than, for example, "based solely on". It will be understood that terms such as "top" and "bottom", "left" and "right", "vertical" and "horizontal", etc., are relative terms used strictly in relation to one another, and do not express or imply any relation with respect to a direction of gravity, a manufacturing device used to manufacture the components described herein, or to some other device to which the components described herein are coupled, mounted, or otherwise attached. The term "coupled" may refer to physical coupling, i.e., direct contact between two elements, and/or electrical coupling, i.e., coupled via a conductive trace or other conductive element. It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not imply that there are only two elements and further does not imply that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements". While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An integrated package, the integrated package comprising:
    an antenna package including:
        an insert made of low-loss material;
        an antenna formed of at least one trace; and
        a substrate, wherein the insert is embedded in the substrate and the at least one trace of the antenna has a surface formed on the substrate and the insert; and
    a bottom package including:
        a substrate;
        a redistribution layer in the substrate having redistribution traces;
        a mold layer in the substrate; and
        a bottom insert made of low-loss material, wherein the mold layer contacts the bottom insert and surrounds a periphery of the insert.

2. The integrated package of claim 1, wherein the antenna is a patch antenna.

3. The integrated package of claim 1, wherein the at least one trace comprises antenna bottom traces disposed at least in part on a bottom surface of the insert and/or antenna top traces disposed at least in part on a top surface of the insert.

4. The integrated package of claim 3, further comprising a through via that traverses the insert and/or the substrate and couples the antenna bottom traces to the antenna top traces.

5. The integrated package of claim 1, wherein the low-loss material of the insert of the antenna package comprises one or more of:
    glass;
    synthetic quartz;
    organic laminate; and/or
    ceramic.

6. The integrated package of claim 1, wherein the mold layer comprises molding compound.

7. The integrated package of claim 1,
    wherein one or more contacts couple the top package to the bottom package.

8. The integrated package of claim 7, wherein:
    the bottom package includes a die; and
    the top package is coupled to the die with a through via.

9. The integrated package of claim 8, wherein:
    the through via is in contact with the bottom insert.

10. The integrated package of claim 1, wherein the bottom package has a smaller footprint than the antenna package.

11. The integrated package of claim 1, wherein the antenna package further comprises:
    one or more antenna package contacts; and
    a bottom layer having vias extending from the at least one trace of the antenna and bottom traces coupling the antenna to the one or more antenna package contacts.

12. The integrated package of claim 1, further comprising:
    a lens disposed over a surface of the antenna package, wherein the lens is configured to focus electromagnetic radiation that is transmitted from and/or received by the antenna package.

* * * * *